United States Patent [19]

Ito et al.

[11] Patent Number: 5,340,435
[45] Date of Patent: Aug. 23, 1994

[54] BONDED WAFER AND METHOD OF MANUFACTURING IT

[76] Inventors: Yatsuo Ito, Sanai-cho 7, Jyouetsu-shi Niigata-ken; Takao Abe, 477-19, Yanase, Annaka-shi, Gunma-ken; Tokio Takei, Hara219-5, Kawanakajima-machi, Nagano-shi, Nagano-ken; Susumu Nakamura, 1822-1, Higashijou-machi, Nagano-shi, Nagano-ken; Hiroko Ota, 1011-5, Ooaza-awasa, Kosyoku-shi, Nagano-ken, all of Japan

[21] Appl. No.: 944

[22] Filed: Jan. 5, 1993

Related U.S. Application Data

[62] Division of Ser. No. 659,952, Feb. 26, 1991, abandoned.

[30] Foreign Application Priority Data

Feb. 28, 1990 [JP] Japan .................. 2-045777

[51] Int. Cl.$^5$ .................. H01L 21/02; H01L 21/027
[52] U.S. Cl. .................. 156/632; 156/630; 156/637; 156/639; 156/645; 156/153; 156/281; 437/225; 437/921; 437/974; 148/DIG. 12; 148/DIG. 135
[58] Field of Search ............. 156/625, 629, 630, 632, 156/637, 639, 645, 153–154, 281; 437/225, 921, 974; 148/DIG. 12, DIG. 135

[56] References Cited

U.S. PATENT DOCUMENTS

| | | |
|---|---|---|
| 4,649,627 | 3/1987 | Abernathey et al. . |
| 4,671,846 | 6/1987 | Shimbo et al. . |
| 4,878,957 | 11/1989 | Yamaguchi et al. . |
| 4,897,366 | 1/1990 | Smeltzer .................. 437/225 X |
| 4,939,101 | 7/1990 | Black et al. ............ 148/DIG. 12 X |
| 5,022,745 | 6/1991 | Zayhowski et al. . |
| 5,087,307 | 2/1992 | Nomura et al. ............ 156/153 X |
| 5,152,857 | 10/1992 | Ito et al. .................. 156/153 |

FOREIGN PATENT DOCUMENTS

| | | |
|---|---|---|
| 136050 | 4/1985 | European Pat. Off. . |
| 166218 | 2/1986 | European Pat. Off. . |
| 335741 | 10/1989 | European Pat. Off. . |
| 337556 | 10/1989 | European Pat. Off. . |
| 362838 | 4/1990 | European Pat. Off. . |
| 58-103144 | 7/1983 | Japan . |
| 61-73345 | 4/1986 | Japan . |
| 62-232930 | 10/1987 | Japan . |
| 63-175484 | 7/1988 | Japan . |
| 63-307200 | 12/1988 | Japan . |
| 2-9148 | 1/1990 | Japan . |

OTHER PUBLICATIONS

Lasky, J. B., "Wafer Bonding for Silicon-On-Insulator Technologies", Applied Physics Letters, vol. 48, No. 1, pp. 78-80, Jan. 1986.

*Primary Examiner*—Jeff H. Aftergut
*Attorney, Agent, or Firm*—Lowe, Price, LeBlanc & Becker

[57] ABSTRACT

A bonded wafer comprising a filmy bond wafer, a base wafer, and an intermediate silicon dioxide layer, wherein the periphery of the bond wafer is etched; this bonded wafer is made by: subjecting the bond wafer to an oxidation treatment to form an oxide film over it; joining the two wafers in a manner such that the oxide film-covered face of the bond wafer is put on the base wafer to thereby sandwich the oxide film between the wafers; heating the combined wafers to thereby create a bonding strength between the two wafers; grinding the exposed face of the bond; etching the periphery of the bond wafer to remove the portion which is not in contact with the base wafer; and polishing the exposed face of the bond wafer until it becomes a thin film.

7 Claims, 3 Drawing Sheets

BONDED WAFER AND METHOD OF MANUFACTURING IT

This application is a division of application Ser. No. 07/659,952 filed Feb. 26, 1991, now abandoned.

BACKGROUND OF THE INVENTION

(1) Field of the Invention

This invention relates to a bonded wafer consisting of two wafers joined together, and to a method of making such bonded wafers.

(2) Description of the Prior Art

As a method for forming a single crystal semiconductor film over a dielectric substrate, there has been known, of old, a technology which is characterized by epitaxially growing a single crystal silicon film or the like over a single crystal sapphire substrate. In this technology, however, because there exists a disagreement in lattice constant between the dielectric substrate and the silicon single crystal which is grown in vapor phase, numerous crystal defects occur in the silicon vapor-phase grown layer, and for this reason this technology is of no practical use.

Another conventional technology of providing a single crystal film on a silicon substrate is characterized by first forming a thermally oxidized oxide film across the surface of the silicon substrate, laying a polycrystal or amorphous silicon film over this oxide film, and applying to this an energy beam such as an electron beam or a laser beam in a manner such that the beam spot thereon is shifted along lines all in one and the same direction to thereby melt the silicon film, and then cooling and solidifying the film to obtain a monolithic single crystal film.

Now, the technology of changing the silicon polycrystal film over the oxide film into the single crystal film by means of the laser beam or the like is disclosed, for example, in Japanese Patent Kokoku 62-34716. According to this publication, a single crystal projection is monolithically formed at a corner of the periphery of a single crystal silicon substrate, and with this projection as the seed crystal, single crystallization of the polycrystal film is effected. Although locallized growth of a single crystal is possible owing to an interaction between the single crystal projection and the molten silicon oxide film, it is difficult to obtain a silicon single crystal film of practical use.

Under the circumstances, bonded wafers having a Si-on-insulation structure (SOI structure) have come to draw attention of scientists in the field. An SOI bonded wafer is made from two semiconductor silicon mirror wafers in the following manner. (Incidentally, a mirror wafer is a wafer at least one of whose two faces has specular gloss.) At least one of the wafers is subjected to an oxidation treatment so that an oxide film is formed over at least one face of the wafer which face has specular gloss. Then, the two wafers are joined together with the specular-glossy faces meeting each other; hence the oxide layer is sandwiched between the wafers. The joined wafers are heated at an appropriate temperature until sufficient bonding strength is created between the wafers. The external face of at least one of the wafers is ground, and thereafter polished until it becomes a thin film. This wafer is called "the bond wafer". The other wafer incidentally is called "the base wafer".

PROBLEMS THE INVENTION SEEKS TO SOLVE

Referring to FIG. 8, when two semiconductor mirror wafers 101, 102 are joined together face to face, as described above, the periphery portions 101a, 102a of the wafers are usually so shaped that they tend to fail to come in contact with each other, as shown at (a) in FIG. 8. In the next step, when the bond wafer 101 is ground, the periphery portion 101a of the bond wafer 101 cracks and chips off the wafer body, as shown at (b) in FIG. 8. As a result, the bond wafer 101 has indented edges, and when seen from above, it has an irregular circumference (periphery contour) as exaggeratedly shown at (d) in FIG. 8. Incidentally, in FIG. 8, the drawing at (a) is a cross section of the wafers 101 and 102 including the periphery portions after they are joined together; the drawing at (b) is a cross section of the wafers 101 and 102 after the bond wafer 101 is ground; the drawing at (c) is a top view of the wafers 101 and 102 after the bond wafer 101 is ground.

If the periphery portion of the bond wafer 101 has indented edges and irregular contour, the edges crack and scatter as the bond wafer 101 is polished later, and the polished surface of the bond wafer 101 is contaminated and scarred with the particles scattered.

The present invention was made in view of the above-stated problem as well as the desire for improving product efficiency; therefore, it is an object of the invention to provide a bonded wafer, and a method for manufacturing it, in which the periphery of the bond wafer is entirely in contact with the base wafer so that the bond wafer does not chip off as it is polished, and hence the bond wafer is not attacked by the harmful wafer particles.

SUMMARY OF THE INVENTION

In order to attain the objects of the invention, the inventors propose a bonded wafer comprising two mirror wafers, namely a filmy bond wafer and a base wafer, and an intermediate oxide layer which is interposed between mirror faces of the two wafers, characterized in that the periphery of the filmy bond wafer is etched.

The inventors further propose a bonded wafer comprising two silicon single crystal mirror wafers, namely a filmy bond wafer and a base wafer, and an intermediate silicon dioxide layer which is interposed between mirror faces of the two mirror wafers, characterized in that the periphery of the filmy bond wafer is etched in a manner such that the contour of the filmy bond wafer is formed entirely within that of the base wafer when viewed from the side of the bond wafer.

Another aspect of the invention is to propose a method for manufacturing a bonded wafer comprising the steps of: subjecting a first mirror wafer to an oxidation treatment to thereby form an oxide film over a mirror face of the first mirror wafer; joining the first mirror wafer with a second mirror wafer in a manner such that the oxide film-covered face of the first mirror wafer is put on a mirror face of the second mirror wafer to thereby sandwich the oxide film between the two wafers; heating the combined wafers at a predetermined temperature to thereby create a bonding strength between the two wafers; grinding the exposed face of the first mirror wafer; and polishing the exposed face of the first mirror wafer to thereby reduce the first mirror wafer to a thin film; the method being characterized by further including the steps, after grinding the first wafer, of masking all of the exposed face of the first wafer except for a periphery portion and at least the exposed face of the second wafer with a corrosion resistant film, stooping the combined wafers in an etching liquid for a predetermined period of time to thereby etch and remove that periphery portion of the first mirror wafer which is not masked, and removing the corrosion resistant film.

In a preferred embodiment, the corrosion resistant film is made of teflon or polyethylene.

Or more preferably, all the exposed surface of the second wafer is masked with a corrosion resistant film made of a wax or a high molecular organic compound.

Still more preferably, an even number of pairs of wafers similar to the bonded pair of wafers described above are stacked together in a row such that like wafers are juxtaposed together, and that the both extremities of this wafer stack are occupied by second wafers, and then this stack of wafers is altogether steeped in the etching liquid.

EFFECTS OF THE INVENTION

According to the present invention, before the polishing step, that portion of the periphery of the bond wafer (first mirror wafer) which is not masked by the protective film and which includes the portion that is not in contact with the base wafer (second wafer) is completely etched and removed from the bond wafer so that the remaining bond wafer contains little portion which is not in contact with the base wafer, so that no particle is chipped and scattered from the bond wafer as it is polished in the next step. As a result, the bond wafer is not contaminated with or scarred by such particles so that the yield of the tips obtained from the bonded wafer is improved.

BRIEF DESCRIPTION OF DRAWINGS

These together with other objects and advantages which will become subsequently apparent reside in the details of operation as more fully hereinafter described and claimed, reference being had to the accompanying drawings forming a part hereof.

AN EMBODIMENT OF THE INVENTION

With reference to the attached drawings, an embodiment of the invention will be explained.

Figure 1A:
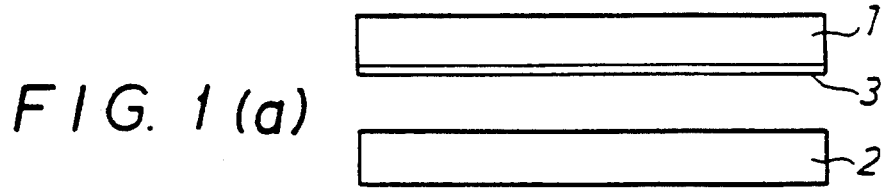
FIGS. 1(a)-1(c) are cross sectional views of wafers useful in explaining a procedure of manufacturing a bonded wafer according to the invention.
Figure 1B:
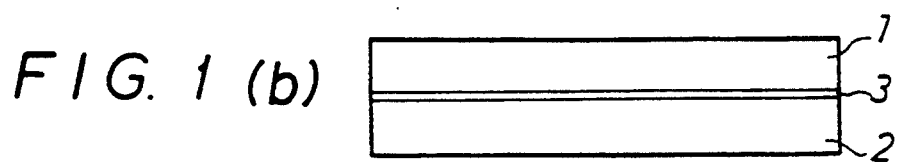
Figure 1C:
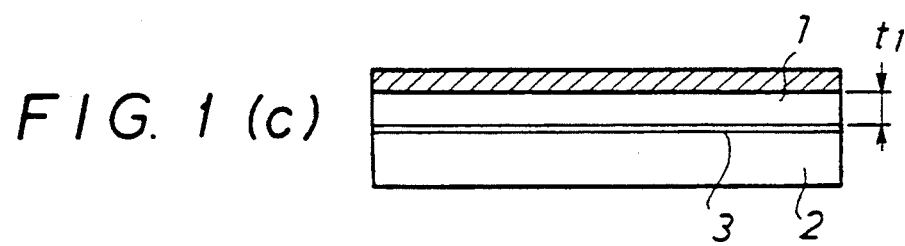

FIG. 1 schematically shows respective cross sections of wafers and illustrates in the order of (a), (b), and (c) how a bonded wafer is fabricated. At (a), two single crystal silicon mirror wafers 1, 2 are prepared. The one of reference numeral 1 is a bond wafer whose upper face, as viewed in FIG. 1, is to be ground and polished and thereby made into the device formation face. The other wafer of reference numeral 2 is a base wafer, which is employed mainly for a protective purpose, that is, for securing mechanical strength of the final bonded wafer when the bond wafer 1 is ground to a fragile thin film. The bond wafer 1 is subjected to a thermal oxidation treatment whereby a thin film 3 of silicon dioxide is formed throughout the lower face of the bond wafer 1 which has specular gloss.

At the next stage (b), the two wafers 1 and 2 are put together in a manner such that the oxide film 3 is sandwiched between the two wafers, as shown, and heated to a predetermined temperature to thereby bind them permanently. Then, at the stage (c), the upper face of the bond wafer 1 is ground until the thickness of the bond wafer 1 reaches a predetermined value t1 (the hatched portion of the bond wafer 1 is ground off).

Figure 2A:
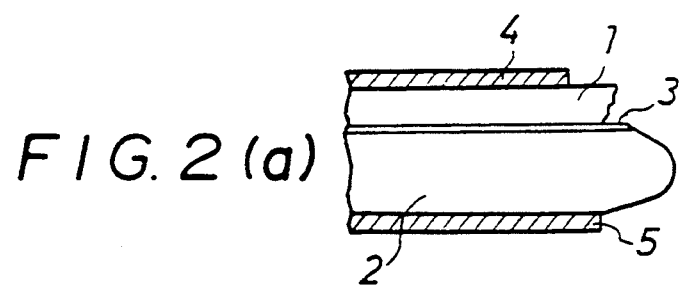
FIGS. 2(a) and 2(b) are a cross sectional view and a top view of wafers useful in explaining a procedure of manufacturing a bonded wafer according to the invention.
Figure 2B:
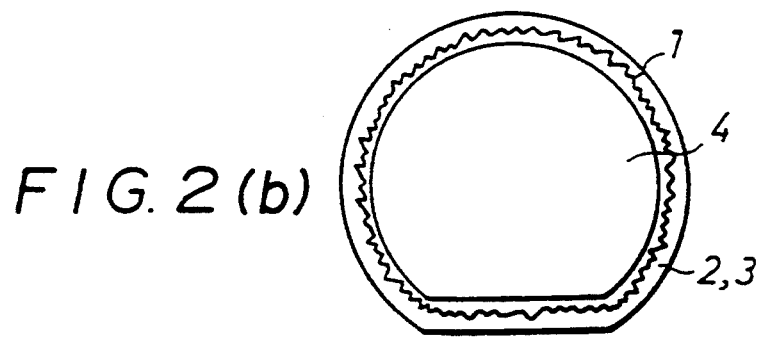

Now, as explained earlier, some of the peripheral portion of the bond wafer 1 is so shaped that it fails to come in contact with the base wafer 2 when the two wafers 1, 2 are joined face to face; consequently, when the bond wafer is ground from the external face, that part of the peripheral portion which is not in contact with the base wafer 2 chips off, as shown at (a) in FIG. 2, and the bond wafer 1 will have an irregular circumference (peripheral contour) as shown at (b) in FIG. 2.

Next, as shown at (a) and (b) in FIG. 2, masking patches 4 and 5 which have diameters smaller than the diameters of the bond wafer 1 and base wafer 2, respectively, are pasted over the wafers 1 and 2, respectively. Now, the entire portion of the bond wafer 1 which is covered with the masking patch 4 is in contact with the base wafer 2. That peripheral portion of the bond wafer 1 which is not sheltered by the masking patch 4 includes all the edges which did not chip off during the grinding operation and are not in contact with the base wafer 3 and therefore still remain to be chipped off during the subsequent polishing remain operation if they there. Incidentally, the masking patch may be made of teflon, polyethylene or the like. Also, in place of such masking patch, it is possible to employ a highly corrosion resistant wax, or other films made of high molecular organic compound.

Figure 3A:
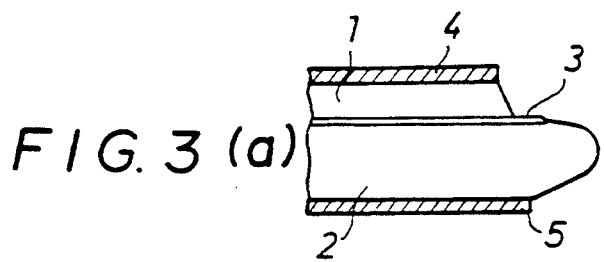
FIGS. 3(a) and 3(b) are cross sectional view and a top view of wafers useful in explaining a procedure of manufacturing a bonded wafer according to the invention.
Figure 3B:
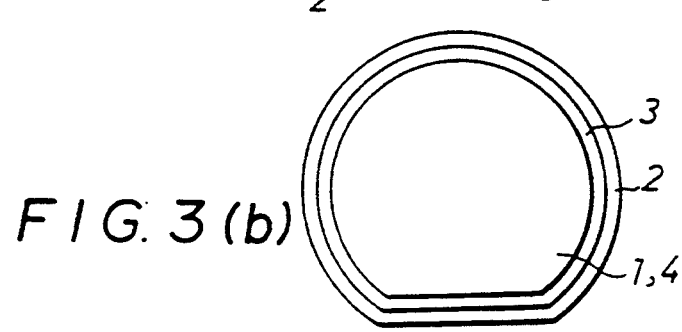

Thereafter, the both wafers 1, 2 are steeped in an etching liquid such as mixed acid (of hydrofluoric acid and nitric acid), potassium hydroxide, and sodium hydroxide for a predetermined period of time, preferably about two minutes, whereby that peripheral portions of the bond wafers 1, 2 which are not covered with the masking patches 4, 5 as well as the periphery of the oxide film 3 are etched and dissolved into the etching liquid. As a result, as shown at (a) and (b) in FIG. 3, the irregular edges of the bond wafer 1, which are not sheltered by the masking patch 4, are completely removed from the periphery of the bond wafer 1. Incidentally, since the etching of the oxide film 3 proceeds more slowly than that of the wafers 1, 2, the peripheral portion of the oxide film 3 are left exposed along the periphery of the bond wafer 1 [ref. (b) in FIG. 3].

After that peripheral portion of the bond wafer 1 which is unsheltered by the masking patch 4 is etched and completely removed, the remaining main body of the bond wafer 1, which is sheltered by the masking patch 4, includes no portion which is not in contact with the base wafer 2; therefore, the bond wafer 1 whose contour is now defined by and along the contour of the masking patch 4 is entirely contacted by the base wafer 2.

Figure 4:
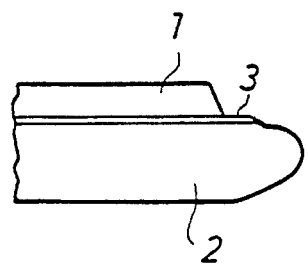
FIG. 4 is a cross sectional view of joined wafers useful in explaining a procedure of manufacturing a bonded wafer according to the invention.
Figure 5A:
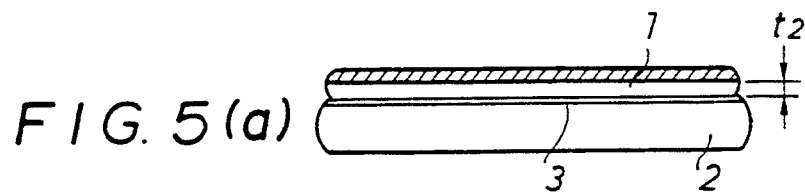
FIGS. 5(a) and 5(b) are cross sectional views of wafers useful in explaining a procedure of manufacturing a bonded wafer according to the invention.
Figure 5B:
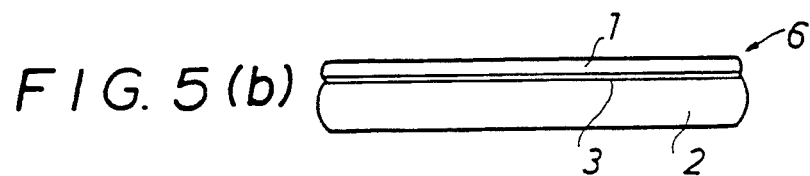

After the etching, the masking patches 4, 5 are peeled off the wafers 1, 2, as shown in FIG. 4. Then, the exposed face of the bond wafer 1 is polished till the thickness thereof becomes a predetermined value t2 (e.g., about 3 μm); the hatched portion of the bond wafer 1, as shown at (a) in FIG. 5, is thus polished off. Thus, a bonded wafer 6 whose periphery is etched is obtained.

Since the periphery of the bond wafer 1 is without that portion which is not in contact with the base wafer 2, the periphery of the bond wafer 1 does not crack and scatter as the upper face of the bond wafer 1 is polished. Therefore, no particle is chipped off and thus the upper face of the bond wafer 1 is not contaminated or scarred.

The bonded wafer 6 thus obtained will have a configuration such that the periphery of the base wafer 2 extends beyond the periphery of the bond wafer 1, and this lends to the bonded wafer 6 various advantages. For example, in a heat treatment, it is possible to place the bonded wafer 6 such that only the base wafer 2 is directly contacted by the boat groove, so that only the base wafer 2 suffers slippage from the boat groove and, therefore, the bond wafer 1 is safe from the damaging effect of the slippage. Also, in a cleaning treatment, when the bonded wafer 6 is placed in a wafer basket, only the periphery of the base wafer 2 touches the wafer basket so that the bond wafer 1 is not contaminated with particles or scarred.

Figure 6:
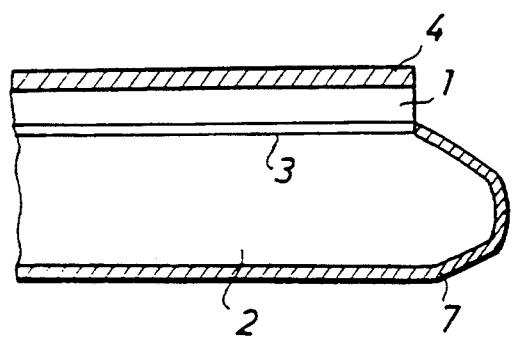
FIG. 6 is a cross sectional view of wafers useful in explaining a procedure of manufacturing a bonded wafer according to the invention.
Figure 8:
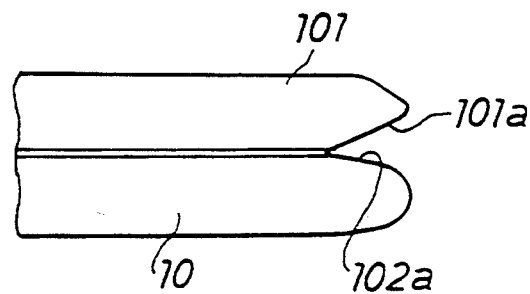
FIG. 8(a)-8(c) are cross sectional views of wafers and a top view of the same wafers useful in explaining a conventional procedure of manufacturing a bonded wafer.
Figure 8:
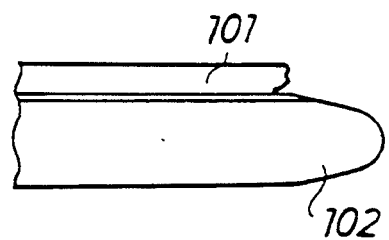
Figure 8:
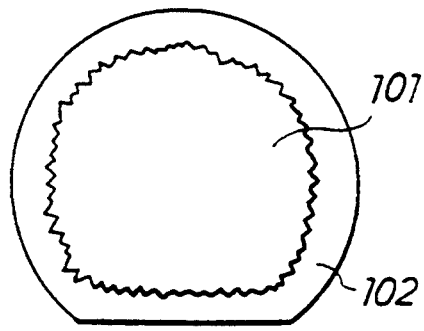

Incidentally, although in the above embodiment the masking patch 5 is pasted on the lower face of the base wafer 2 [ref. (a) in FIG. 8], it is possible, as an alternative measure, to cover all the surface of the base wafer 2 except for its bonding interface with a protective film 7 such as an oxide film and a wax, as shown in FIG. 6, whereby it becomes unnecessary to paste the masking patch 5.

Figure 7:
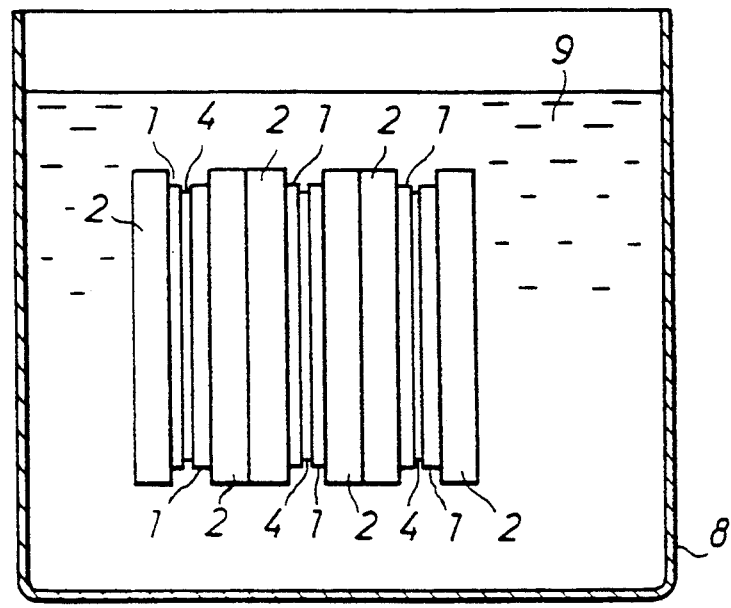
FIG. 7 is a cross sectional view showing an example of etching.

FIG. 7 shows a procedure of etching a plurality of bonded wafers at a time. An even number of bonded wafers are prepared each consisting of the base wafer 2 covered with a protective film and the bond wafer 1 covered with the masking patch 4. These bonded wafers are stacked together in a manner such that the base wafers 2, 2 are put together back to back and the bond wafers 1, 1 are put together via the masking patches 4, 4 and the extremities of this wafer sandwich are occupied by the base wafers 2, 2, as shown in FIG. 7. Then, keeping the bonded wafers together, the sandwich of the wafers is steeped in an etching liquid 9 contained in a container 8 whereby the peripheries of all the bond wafers 1 are simultaneously etched. This way the production efficiency of the bonded wafer is multiplied. This procedure can also be employed in the case where the base wafers are covered with the patches 5 instead of being entirely covered with the protective film.

What is claimed is:

1. A method for manufacturing a bonded wafer comprising the sequential steps of:
    subjecting a first mirror wafer to an oxidation treatment to thereby form an oxide film over a mirror face of the first mirror wafer;
    joining the first mirror wafer with a second mirror wafer in a manner such that said oxide film-covered face of said first mirror wafer is put on a mirror face of said second mirror wafer to thereby sandwich said oxide film between the two wafers;
    heating the combined wafers at a predetermined temperature to thereby create a bond between the two wafers to form combined wafers whereby the first and second mirror wafers each have an exposed face on opposite sides of the combined wafers;
    grinding the exposed face of said first mirror wafer;
    masking all the exposed face of said first wafer except for a periphery portion thereof and at least the exposed face of said second wafer with a corrosion resistant film;
    steeping the combined wafers in an etching liquid for a predetermined period of time to thereby etch and remove the periphery portion of the first mirror wafer which is not masked;
    removing said corrosion resistant film and;
    polishing said exposed face of said first mirror wafer to thereby reduce the first mirror wafer to a thin film.

2. The method as claimed in claim 1 wherein said corrosion resistant film is a masking patch made of polytetrafluoroethylene or polyethylene.

3. The method as claimed in claim 1 where said corrosion resistant film is a wax layer, a high molecular organic compound film, or an oxide film.

4. The method as claimed in claim 1 wherein all the exposed surface of said second wafer is masked with a corrosion resistant film made of a wax or a high molecular organic compound.

5. The method as claimed in claim 4 wherein an even number of pairs of wafers similar to the pair prepared in claim 5 are stacked together in a row such that like wafers are juxtaposed together, and that both extremities of this wafer stack are occupied by second wafers, and then this stack of wafers is altogether steeped in said etching liquid.

6. The method as claimed in claim 1 wherein said first and second mirror wafers are silicon single crystal mirror wafers, said intermediate oxide layer is an intermediate silicon dioxide layer, said etching liquid is sodium hydroxide or potassium hydroxide or a mixture of hydrofluoric acid and nitric acid, and said etching time is about two minutes.

7. The method as claimed in claim 1 wherein said first mirror wafer is ground and polished until its thickness becomes about 3 μm.

* * * * *